United States Patent
Hu et al.

(10) Patent No.: US 12,033,883 B2
(45) Date of Patent: Jul. 9, 2024

(54) FAN-OUT INTERCONNECT STRUCTURE AND METHODS FORMING THE SAME

(71) Applicant: Taiwan Semiconductor Manufacturing Co., Ltd., Hsinchu (TW)

(72) Inventors: Yu-Hsiang Hu, Hsinchu (TW); Chung-Shi Liu, Hsinchu (TW); Hung-Jui Kuo, Hsinchu (TW); Ming-Da Cheng, Taoyuan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/805,557

(22) Filed: Jun. 6, 2022

(65) Prior Publication Data

US 2022/0301919 A1 Sep. 22, 2022

Related U.S. Application Data

(60) Continuation of application No. 16/812,451, filed on Mar. 9, 2020, now Pat. No. 11,355,378, which is a
(Continued)

(51) Int. Cl.
*H01L 21/683* (2006.01)
*H01L 21/288* (2006.01)
(Continued)

(52) U.S. Cl.
CPC ...... *H01L 21/6835* (2013.01); *H01L 21/2885* (2013.01); *H01L 21/486* (2013.01); *H01L 21/6836* (2013.01); *H01L 23/3128* (2013.01); *H01L 23/5389* (2013.01); *H01L 21/568* (2013.01); *H01L 23/49816* (2013.01);
(Continued)

(58) Field of Classification Search
CPC ....... H01L 2924/00; H01L 2924/01322; H01L 21/568; H01L 2224/04105; H01L 2224/73267; H01L 21/56; H01L 2224/0239; H01L 2224/05024; H01L 21/486; H01L 21/6835; H01L 2221/68345; H01L 2221/68359; H01L 2224/83005; H01L 2224/92244

See application file for complete search history.

(56) References Cited

U.S. PATENT DOCUMENTS 6,225,191 B1 5/2001 Ahlquist et al.
8,361,842 B2 1/2013 Yu et al.
(Continued)

FOREIGN PATENT DOCUMENTS

CN 101996896 A 3/2011
CN 102324418 A 1/2012
(Continued)

*Primary Examiner* — Monica D Harrison
*Assistant Examiner* — Andre C Stevenson
(74) *Attorney, Agent, or Firm* — Slater Matsil, LLP

(57) ABSTRACT

A method includes forming an adhesive layer over a carrier, forming a sacrificial layer over the adhesive layer, forming through-vias over the sacrificial layer, and placing a device die over the sacrificial layer. The Method further includes molding and planarizing the device die and the through-vias, de-bonding the carrier by removing the adhesive layer, and removing the sacrificial layer.

20 Claims, 24 Drawing Sheets

Related U.S. Application Data continuation of application No. 15/601,310, filed on May 22, 2017, now Pat. No. 10,586,724, which is a division of application No. 14/690,015, filed on Apr. 17, 2015, now Pat. No. 9,659,805.

(51) Int. Cl.
  *H01L 21/48* (2006.01)
  *H01L 21/56* (2006.01)
  *H01L 23/31* (2006.01)
  *H01L 23/498* (2006.01)
  *H01L 23/538* (2006.01)

(52) U.S. Cl.
  CPC ............... *H01L 2221/68345* (2013.01); *H01L 2221/68359* (2013.01); *H01L 2221/68381* (2013.01); *H01L 2224/04105* (2013.01); *H01L 2224/12105* (2013.01); *H01L 2224/19* (2013.01); *H01L 2224/32225* (2013.01); *H01L 2224/73267* (2013.01); *H01L 2224/83005* (2013.01); *H01L 2224/92244* (2013.01)

(56) References Cited

U.S. PATENT DOCUMENTS

| | | | |
|---|---|---|---|
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,865,525 | B2 | 10/2014 | Lin et al. |
| 9,111,914 | B2 | 8/2015 | Lin et al. |
| 9,324,672 | B2 | 4/2016 | Pagaila |
| 9,431,369 | B2 | 8/2016 | Chih et al. |
| 2005/0079338 | A1* | 4/2005 | Toyoda ................. H01L 21/268 428/304.4 |
| 2007/0210461 | A1 | 9/2007 | Fay et al. |
| 2007/0281471 | A1 | 12/2007 | Hurwitz et al. |
| 2011/0006297 | A1 | 1/2011 | Inoue et al. |
| 2011/0063776 | A1 | 3/2011 | Byrne et al. |
| 2011/0241214 | A1 | 10/2011 | Feng et al. |
| 2011/0291288 | A1 | 12/2011 | Wu et al. |
| 2012/0235306 | A1 | 9/2012 | Feng et al. |
| 2012/0256300 | A1* | 10/2012 | Nakamura .......... H01L 21/6836 438/109 |
| 2013/0026468 | A1 | 1/2013 | Yoshimuta et al. |
| 2013/0026599 | A1* | 1/2013 | Nakamura ............... H01L 24/14 257/508 |
| 2013/0037929 | A1 | 2/2013 | Essig et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0307140 | A1 | 11/2013 | Huang et al. |
| 2014/0021583 | A1 | 1/2014 | Lo et al. |
| 2014/0131858 | A1 | 5/2014 | Pan et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0320099 | A1 | 10/2014 | Chen |
| 2015/0063776 | A1 | 3/2015 | Ross et al. |
| 2015/0093844 | A1 | 4/2015 | Hsia et al. |
| 2015/0348861 | A1 | 12/2015 | Chia et al. |
| 2016/0013045 | A1 | 1/2016 | Nie et al. |
| 2016/0023242 | A1 | 1/2016 | Kundaliya et al. |
| 2016/0056057 | A1 | 2/2016 | Yu et al. |

FOREIGN PATENT DOCUMENTS

| | | |
|---|---|---|
| CN | 103872012 A | 6/2014 |
| CN | 104282649 A | 1/2015 |
| CN | 104332456 A | 2/2015 |
| KR | 20140061959 A | 5/2014 |

* cited by examiner

FAN-OUT INTERCONNECT STRUCTURE AND METHODS FORMING THE SAME

PRIORITY CLAIM AND CROSS-REFERENCE

This application is a continuation of U.S. patent application Ser. No. 16/812,451, entitled "Fan-Out Interconnect Structure and Methods Forming the Same," filed Mar. 9, 2020, which is a continuation of U.S. patent application Ser. No. 15/601,310, entitled "Fan-Out Interconnect Structure and Methods Forming the Same," filed May 22, 2017, now U.S. Pat. No. 10,586,724 issued Mar. 10, 2020, which is a divisional of U.S. patent application Ser. No. 14/690,015, entitled "Fan-Out Interconnect Structure and Methods Forming the Same," filed on Apr. 17, 2015, now U.S. Pat. No. 9,659,805 issued May 23, 2017, which applications are incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded in order to expand the integration ability of the packages, was developed. With a high degree of integration, the electrical performance of the resulting PoP package can be improved benefiting from the shortened connecting paths between components. By using the PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
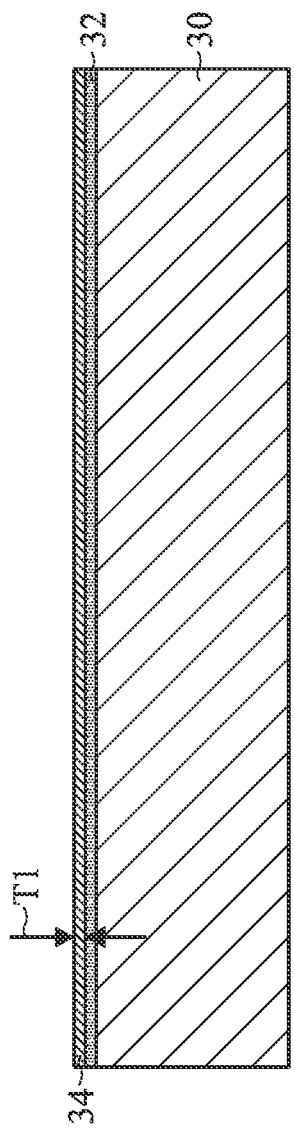
FIGS. 1 through 12 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A fan-out package and the method of forming the package are provided in accordance with various exemplary embodiments. The variations of the embodiments are discussed. Throughout the various views and illustrative embodiments, like reference numbers are used to designate like elements.

FIGS. 1 through 23 illustrate the cross-sectional views of intermediate stages in the formation a package in accordance with some embodiments. The steps shown in FIGS. 1 through 23 are also illustrated schematically in the process flow 200 shown in FIG. 24. In the subsequent discussion, the process steps shown in FIGS. 1 through 23 are discussed referring to the process steps in FIG. 24.

Referring to FIG. 1, carrier 30 is provided, and adhesive layer 32 is disposed over carrier 30. Carrier 30 may be a blank glass carrier, a blank ceramic carrier, or the like, and may have a shape of a semiconductor wafer with a round top-view shape. Carrier 30 is sometimes referred to as a carrier wafer. Adhesive layer 32 may be formed of a Light-to-Heat Conversion (LTHC) material, for example, although other types of adhesives may be used. In accordance with some embodiments of the present disclosure, adhesive layer 32 has the function of decomposing under the heat of light, and hence can release carrier 30 from the structure formed thereon.

Sacrificial layer 34 is then formed over adhesive layer 32. The respective step is shown as step 202 in the process flow shown in FIG. 24. Sacrificial layer 34 has the function of protecting adhesive layer 32. The material of sacrificial layer 34 is selected to be resistive to the chemicals used in subsequent processes shown in FIGS. 2 through 7. Furthermore, sacrificial layer 34 is dense enough, so that the chemicals used in the processes shown in FIGS. 2 through 7 do not penetrate through sacrificial layer 34 to damage adhesive layer 32. In accordance with some embodiments of the present disclosure, sacrificial layer 34 is an organic layer formed of an organic material such as hexamethyldisilane (HMDS). In some exemplary embodiments, the formation of sacrificial layer 34 includes placing carrier 30 in a chamber, and conducting HMDS gas into the chamber. The pressure of the HMDS gas may be one atmosphere, or may be higher or lower than one atmosphere. The temperature of carrier 30 may be in the range between about 100° C. and about 150° C. The bonds of the HMDS gas connect with the surface bonds of the underlying adhesive layer 32 to form sacrificial layer 34. For example, with adhesive layer 32 being an LTHC layer, the HMDS gas form bonds with the OH functional groups of the LTHC layer to form adhesive layer 32. The resulting LTHC layer may be as thin as one or two (or slightly more, such as fewer than five) mono layers. The formation time may be in the range between about 2 minutes and about 5 minutes. Accordingly, thickness T1 of LTHC layer 34 may be in the range from several angstroms to about 20 angstroms.

In accordance with alternative embodiments of the present disclosure, sacrificial layer 34 is a metal layer such as a titanium layer. An advantageous feature of using titanium to form sacrificial layer 34 is that in subsequent process steps, an etching process may be omitted since the sacrificial layer 34, when formed of titanium, may be removed simultaneously with the removal of the titanium layer in subsequently formed metal seed layer. In these embodiments, sacrificial layer 34 may be formed using Physical Vapor Deposition (PVD), such as sputtering.

In accordance with yet alternative embodiments of the present disclosure, sacrificial layer 34 is an in inorganic dielectric layer such as an oxide layer, which may be a silicon dioxide layer. In these embodiments, sacrificial layer 34 may be formed using Chemical Vapor Deposition (CVD), Plasma Enhance Chemical Vapor Deposition (PECVD), or other applicable methods.

Figure 2:
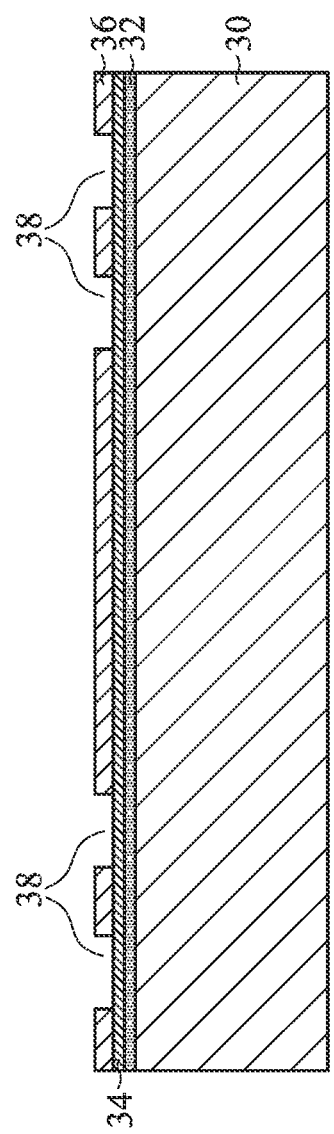

Referring to FIG. 2, dielectric layer 36 is formed over sacrificial layer 34. The respective step is shown as step 204 in the process flow shown in FIG. 24. Step 204 is illustrated as dashed since in some embodiments, such as the embodiments shown in FIGS. 13 through 23, dielectric layer 36 is not formed. The bottom surface of dielectric layer 36 is in contact with the top surfaces of sacrificial layer 34. In accordance with some embodiments of the present disclosure, dielectric layer 36 is formed of a polymer, which may be a photo-sensitive polymer such as polybenzoxazole (PBO), polyimide, or the like. In alternative embodiments, dielectric layer 36 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. Dielectric layer 36 is then patterned to form openings 38 therein. Hence, sacrificial layer 34 is exposed through openings 38 in dielectric layer 36.

Figure 3:
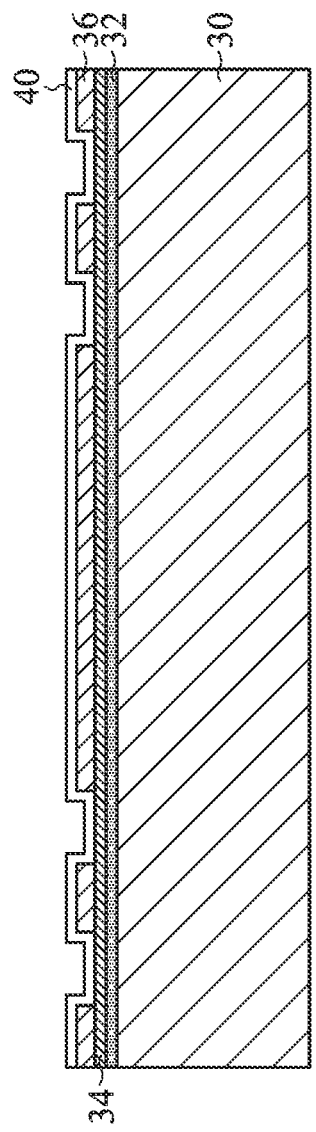

Referring to FIG. 3, seed layer 40 is formed over sacrificial layer 34, for example, through PVD. The respective step is shown as step 206 in the process flow shown in FIG. 24. Seed layer 40 may be a metal seed layer comprising copper, aluminum, titanium, or multi-layers thereof. In some embodiments, seed layer 40 comprises a first metal layer such as a titanium layer (not shown) and a copper layer (not shown in FIG. 3, refer to FIG. 14) over the titanium layer. In these embodiments, seed layer 40 has some portions in contact with sacrificial layer 34. In alternative embodiments, seed layer 40 includes a single copper layer.

Figure 4:
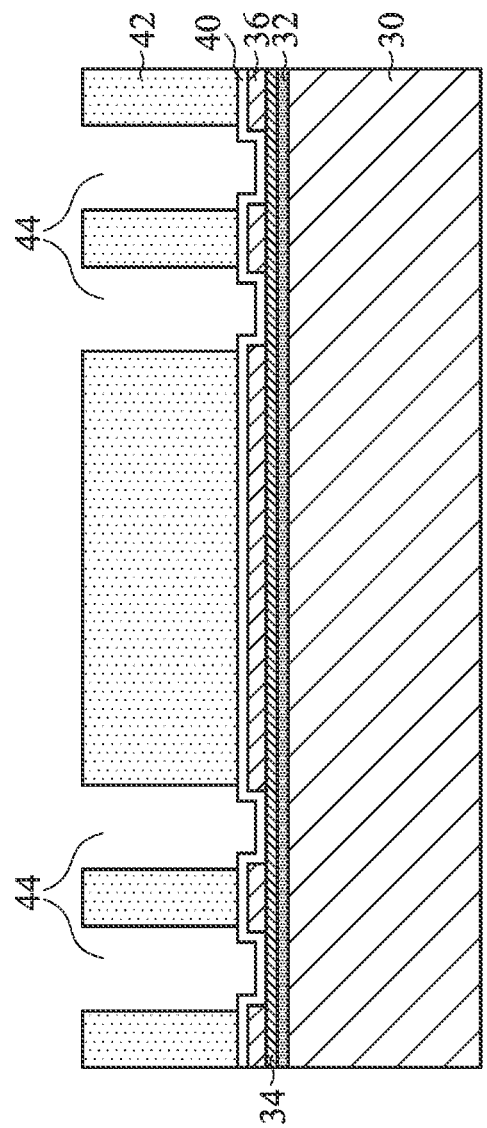

FIGS. 4 through 7 illustrate the formation of through-vias. The respective step is shown as step 208 in the process flow shown in FIG. 24. As shown in FIG. 4, photo resist 42 is applied over seed layer 40 and is then patterned. In accordance with some embodiments of the present disclosure, photo resist 42 is a dry film, which is laminated onto metal seed layer 40. In accordance with alternative embodiments, photo resist 42 is formed by spin coating. As a result of the patterning (exposure and developing), openings 44 are formed in photo resist 42, through which some portions of seed layer 40 are exposed.

Figure 5:
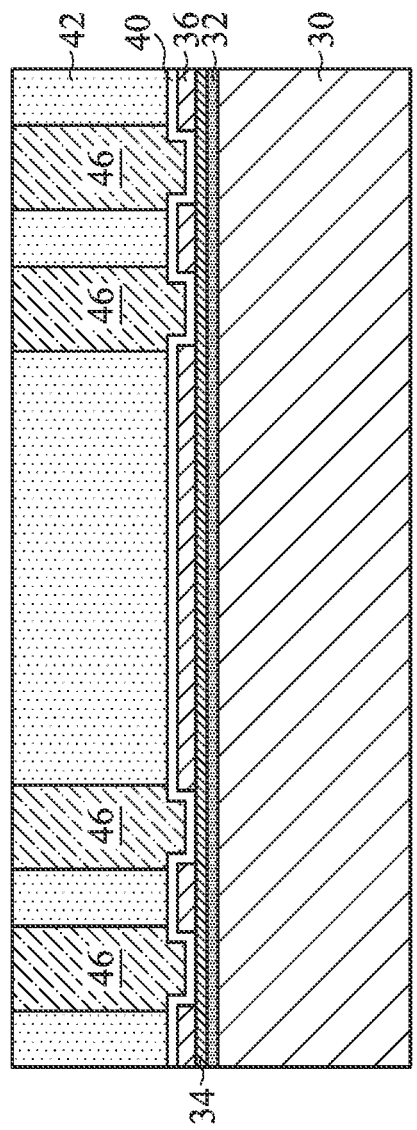

As shown in FIG. 5, through-vias 46 are formed in openings 44 through plating, which may be electro plating or electro-less plating. Through-vias 46 are plated on the exposed portions of seed layer 40. Through-vias 46 are conductive, and may be metal vias including copper, aluminum, tungsten, nickel, or alloys thereof. The top-view shapes of through-vias 46 include, and are not limited to, rectangles, squares, circles, and the like. The heights of through-vias 46 are determined by the thickness of the subsequently placed device die 48 (FIG. 8), with the heights of through-vias 46 slightly greater than or equal to the thicknesses of device die 48 in various embodiments.

Figure 6:
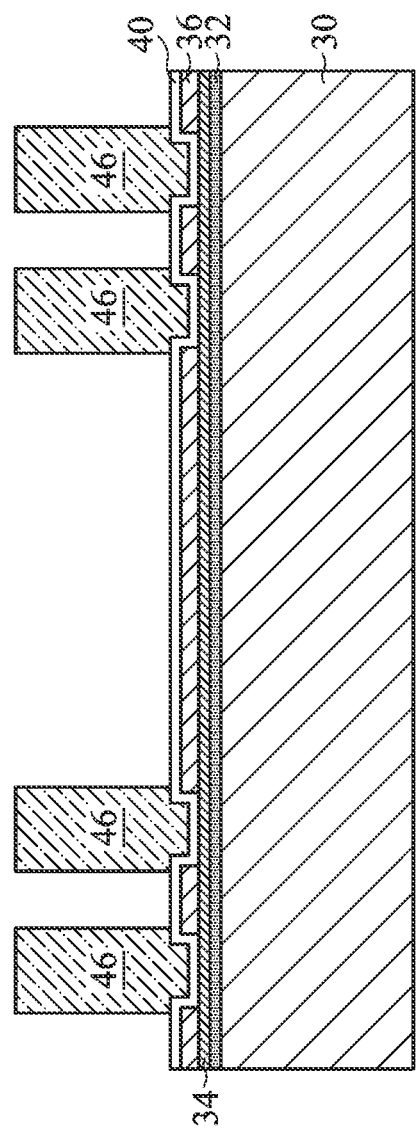
Figure 7:
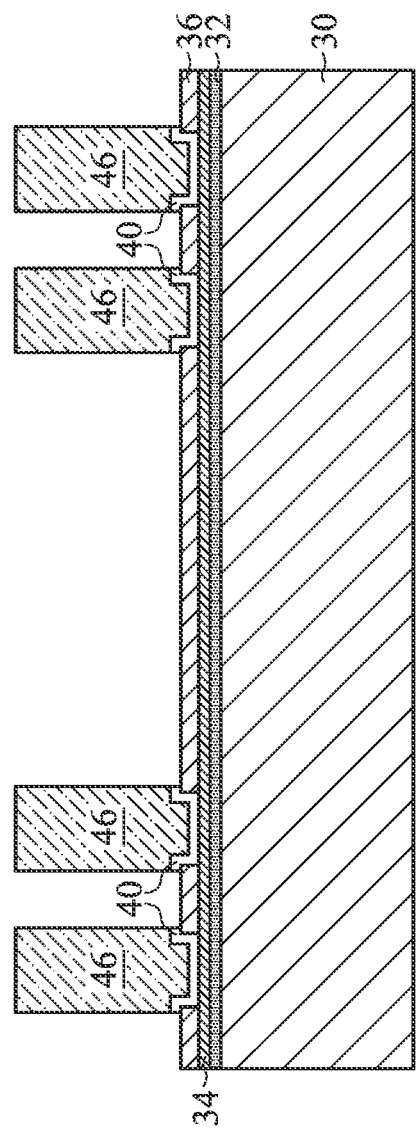

After the plating of through-vias 46, photo resist 42 is removed, and the resulting structure is shown in FIG. 6. As a result, the portions of seed layer 40 that are covered by photo resist 42 are exposed. Next, as shown in FIG. 7, an etching step is performed to remove the exposed portions of seed layer 40, wherein the etching may be an anisotropic or isotropic etching. The respective step is shown as step 210 in the process flow shown in FIG. 24. The portions of seed layer 40 that are overlapped by through-vias 46, on the other hand, remain not etched. Throughout the description, the remaining underlying portions of seed layer 40 are referred to as the bottom portions of through-vias 46. Although seed layer 40 is shown as having distinguishable interfaces with the overlying portions of through-vias 46, when seed layer 40 is formed of a material similar to or the same as that of the respective overlying through-vias 46, seed layer 40 may be merged with through-vias 46 with no distinguishable interface therebetween. For example, the copper layer in seed layer 40 may be merged with through-vias 46 with no distinguishable interface. In alternative embodiments, there exist distinguishable interfaces between seed layer 40 and the overlying plated portions of through-vias 46. For example, the titanium layer in seed layer 40 may be distinguished from the copper-containing through-vias 46. As a result of the etching of seed layer 40, dielectric layer 36 is exposed.

Figure 9:
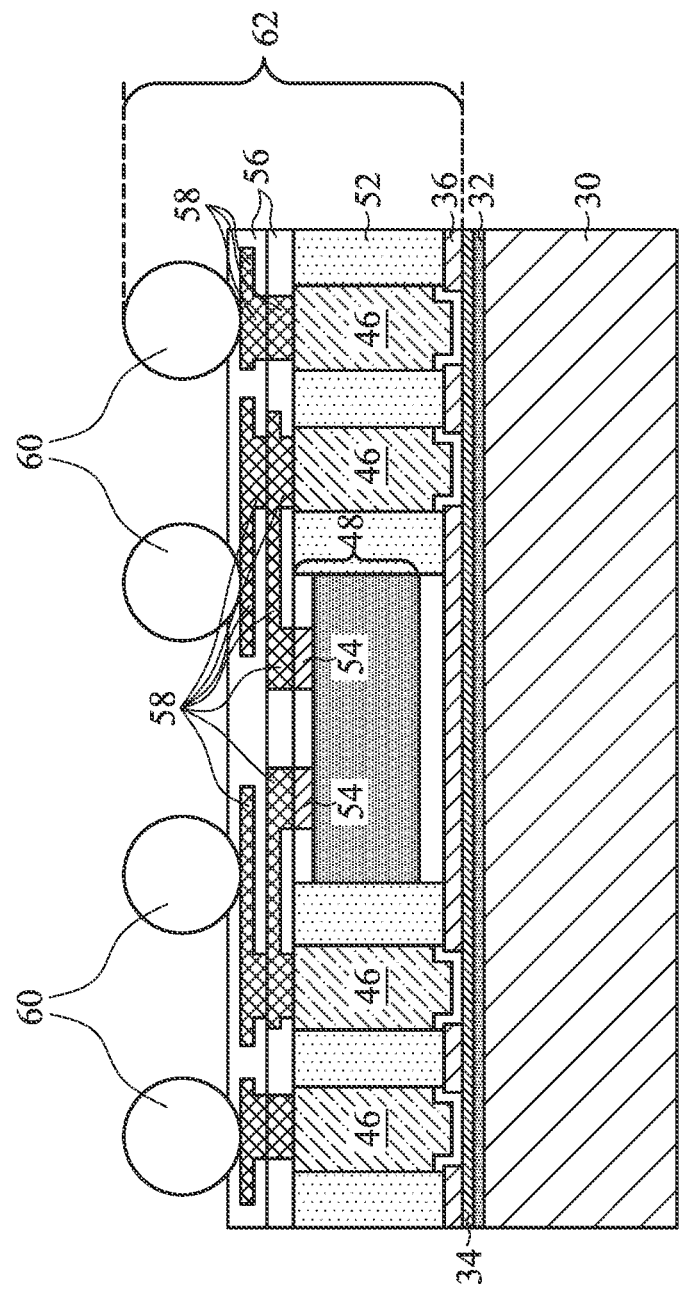
Figure 10:
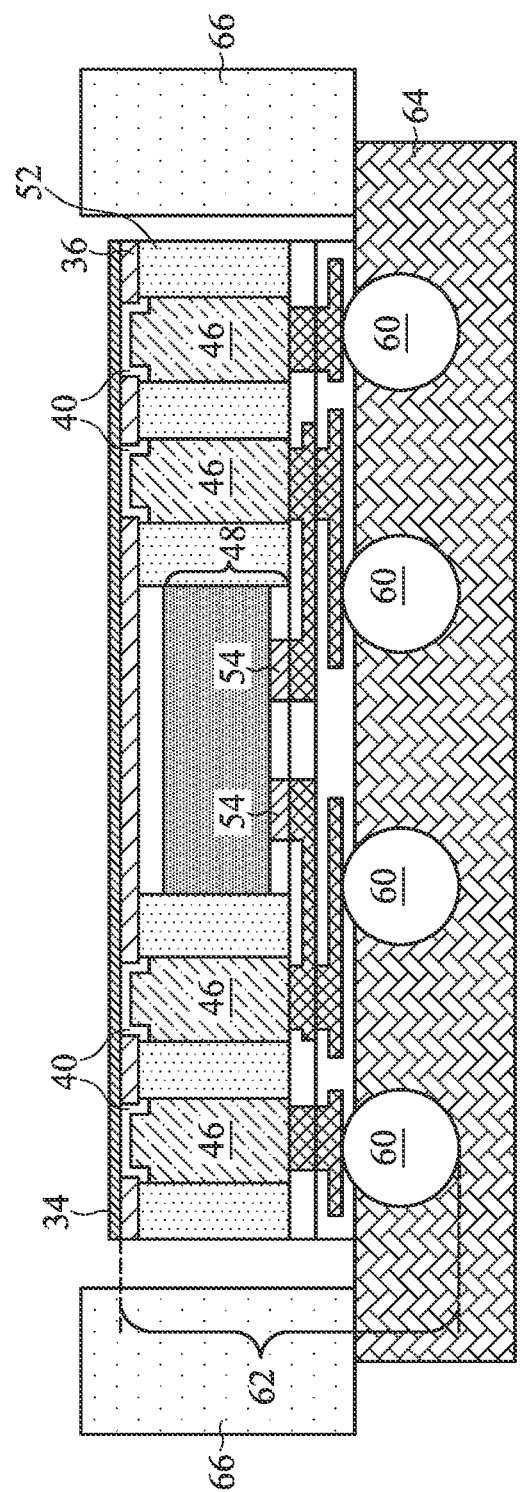

As shown in FIGS. 2 through 7, there is a plurality of processes performed during the existence of adhesive layer 32, which may be an LTHC layer. These processes include, for example, the patterning of dielectric layer 36, the developing of photo resist 42, the removal of photo resist 42, the etching of seed layer 40, and the corresponding cleaning processes subsequent to these processes. Adhesive layer 32 may be prone to the damage of the chemicals used in these processes if it is exposed to the chemicals. If adhesive layer 32 is damaged, in the de-bonding process as shown in FIGS. 9 and 10, it is difficult to de-bonding package 62 (FIG. 9) from carrier 30, and package 62 may be damaged. Advantageously, in accordance with the embodiments of the present disclosure, sacrificial layer 34 is used to block the chemicals from reaching adhesive layer 32 in the processes shown in FIGS. 2 through 7, and adhesive layer 32 is protected from the damage.

Figure 8:
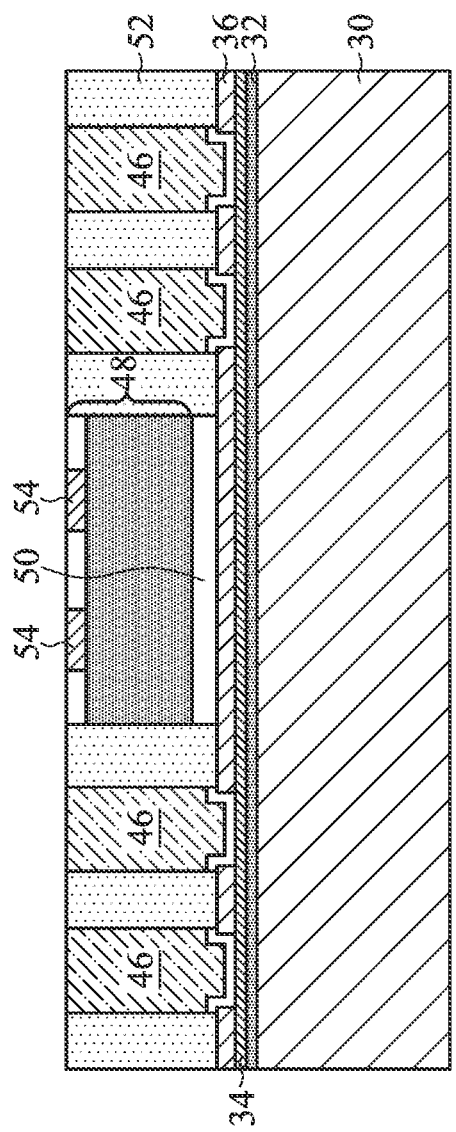

FIG. 8 illustrates the placement of device die 48 over sacrificial layer 34. The respective step is shown as step 212 in the process flow shown in FIG. 24. Device die 48 may be adhered to dielectric layer 36 through die attach film 50. Although FIG. 8 illustrates the placement of a single device die 48, a plurality of device dies 48 may be placed over dielectric layer 36, wherein the plurality of placed device dies 48 may be arranged as an array including a plurality of rows and a plurality of columns.

Also referring to FIG. 8, molding material 52 is molded on device die 48 and through-vias 46. The respective step is shown as step 214 in the process flow shown in FIG. 24. Molding material 52 is dispensed as a fluid and is then cured. Molding material 52 fills the gaps between device die 48 and through-vias 46, and may be in contact with dielectric layer 36. Molding material 52 may include a molding compound, a molding underfill, an epoxy, or a resin. After the molding process, the top surface of molding material 52 is higher than the top ends of metal pillars 54 and through-vias 46.

Next, a planarization step such as a Chemical Mechanical Polish (CMP) step or a grinding step is performed to thin molding material 52, until through-vias 46 are exposed. The respective step is also shown as step 214 in the process flow shown in FIG. 24. Metal pillars 54 of device die 48 are thus exposed as a result of the planarization. Metal pillars 54 are electrically coupled to the integrated circuits inside device die 48. Due to the planarization, the top surfaces of through-vias 46 are substantially level (coplanar) with the top surfaces of metal pillars 54, and are substantially level (coplanar) with the top surface of molding material 52.

Referring to FIG. 9, one or more layers of dielectric layers 56 and the respective Redistribution Lines (RDLs) 58 are formed over molding material 52, through-vias 46, and metal pillars 54. The respective step is shown as step 216 in the process flow shown in FIG. 24. RDLs 58 are referred to as front side RDLs since they are on the front side of device die 48. In accordance with some embodiments of the present disclosure, dielectric layers 56 are formed of a polymer(s) such as PBO, polyimide, or the like. In accordance with alternative embodiments of the present disclosure, dielectric layers 56 are formed of an inorganic dielectric material such as silicon nitride, silicon oxide, silicon oxynitride, or the like.

Redistribution Lines (RDLs) 58 are formed to electrically couple to metal pillars 54 and through-vias 46. RDLs 58 may also interconnect metal pillars 54 and through-vias 46. RDLs 58 may include metal traces (metal lines) and vias underlying and connected to the metal traces. In accordance with some embodiments of the present disclosure, RDLs 58 are formed through plating processes, wherein each of RDLs 58 includes a seed layer (not shown) and a plated metallic material over the seed layer. The seed layer and the plated metallic material may be formed of the same material or different materials.

FIG. 9 also illustrates the formation of electrical connectors 60 in accordance with some exemplary embodiments. Electrical connectors 60 are electrically coupled to RDLs 58, metal pillars 54, and/or through-vias 46. The formation of electrical connectors 60 may include placing solder balls over RDLs 58 and then reflowing the solder balls. In accordance with alternative embodiments, the formation of electrical connectors 60 includes performing a plating step to form solder regions over RDLs 58 and then reflowing the solder regions. Electrical connectors 60 may also include metal pillars, or metal pillars and solder caps, which may also be formed through plating. Throughout the description, the combined structure including device die 48, through-vias 46, molding material 52, RDLs 58, and dielectric layers 56 will be referred to as package 62, which may be a composite wafer including a plurality of device dies 48.

FIG. 9 illustrates two RDL layers 58. In accordance with alternative embodiments, there may be a single layer of RDLs 58 or more than two layers of RDLs 58, depending on the routing requirement of the respective package. In accordance with yet alternative embodiments of the present disclosure, there are no RDLs, and electrically connectors 60 are formed directly over through-vias 46 and metal pillars 54, with no RDLs between connectors 60 and the underlying through-vias 46 as well as metal pillars 54.

Next, package 62 is de-bonded from carrier 30, and is then sawed apart in a die-saw step. In some exemplary de-boding process, dicing tape 64 (FIG. 10) is attached to package 62 to protect electrical connectors 60, wherein dicing tape 64 is fixed by dicing frame 66. The de-bonding is performed, for example, by projecting a UV light or a laser on adhesive layer 32 (FIG. 9). For example, when adhesive layer 32 is formed of LTHC, the heat generated from the light or laser causes the LTHC to be decomposed, and hence carrier 30 is detached from package 62. The resulting structure is shown in FIG. 10.

FIG. 10 illustrates the resulting structure after the de-bonding of carrier 30. Sacrificial layer 34 may remain or may be removed as a result of the de-bonding process, depending on the material of sacrificial layer 34. Accordingly, sacrificial layer 34 is illustrated using dashed lines. In the embodiments wherein sacrificial layer 34 is formed of HMDS, since HMDS is very thin, it may be removed (and may be removed entirely) along with the decomposed adhesive layer 32, and no additional process is needed to remove sacrificial layer 34.

If sacrificial layer 34 remains after the de-bonding, an etching process is performed to remove sacrificial layer 34, which will be removed entirely. The respective step is shown as step 218 in the process flow shown in FIG. 24. In the embodiments wherein sacrificial layer 34 is formed of titanium or an inorganic dielectric material such as silicon oxide, sacrificial layer 34 may be removed along with the titanium layer in the remaining portions of seed layer 40. For example, Hydrogen Fluoride (HF) gas or a diluted HF solution may be used to etch sacrificial layer 34 that is formed of titanium or silicon oxide. In addition, the titanium layer in seed layer 40 is also removed in the same etching process. The copper in metal seed layer 40 is exposed, and hence the subsequently formed backside RDLs or electrical connectors such as solder regions may be formed thereon. The resulting structure is shown in FIG. 11.

Figure 11:
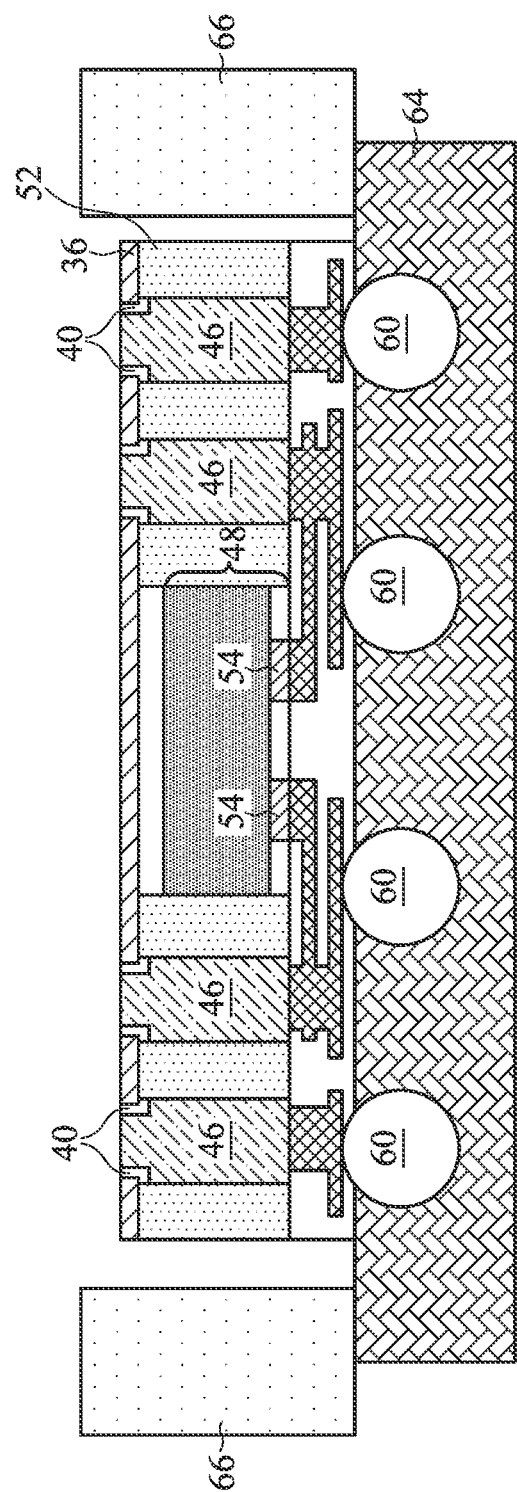

In FIG. 11, the top portions of seed layer 40 is illustrated as being removed entirely from the top surfaces of through-vias 46, although the copper layer in the top portions of metal seed layer 40 may actually remain on the top surfaces of through-vias 46. The copper layer of seed layer 40 may also be removed from the top surfaces of through-vias 46 due to the over-etching occurring in the etching of sacrificial layer 34.

Figure 12:
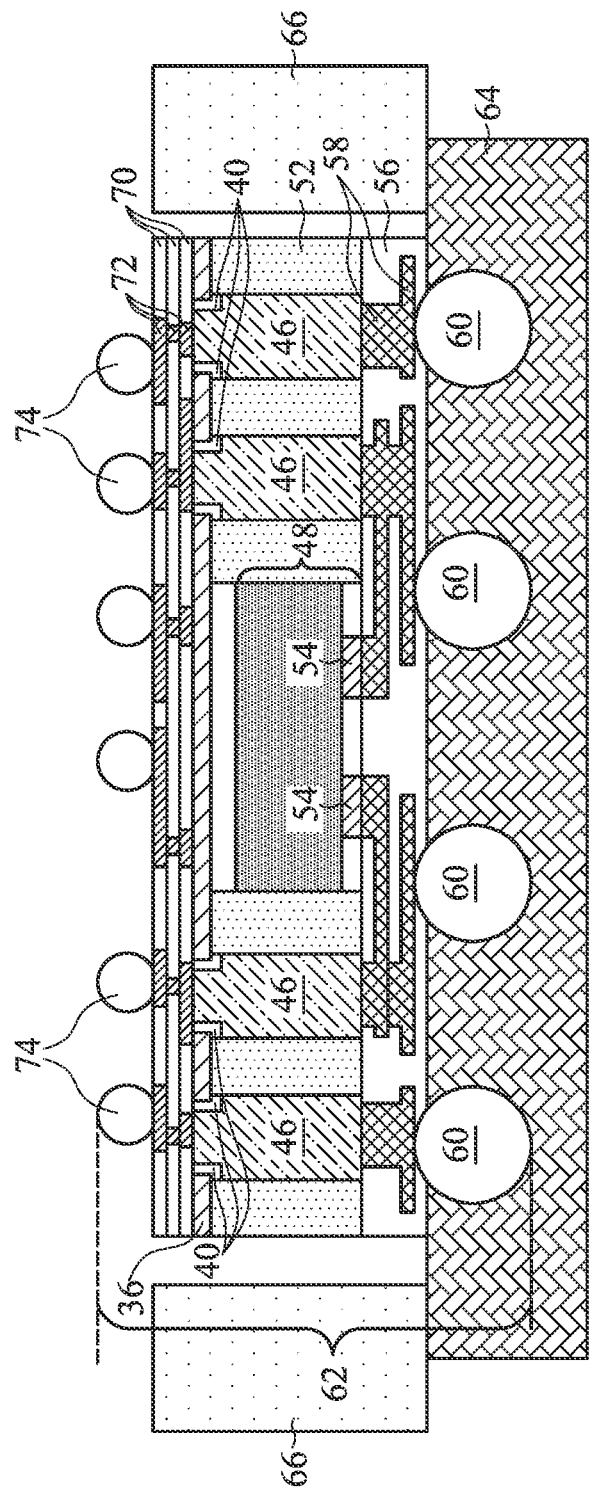

FIG. 12 illustrates the formation of backside RDLs and/or the electrical connectors in accordance with some exemplary embodiments. The respective step is shown as step 220 in the process flow shown in FIG. 24. Dielectric layers 70 and RDLs 72 are formed on the backside of device die 48, with RDLs 72 electrically coupled to through-vias 46. In accordance with some embodiments of the present disclosure, there is a single backside RDL layer. In accordance with alternative embodiments, as illustrated in FIG. 12, the illustrated RDLs 72 represent more than one RDL layer, wherein vias are formed to interconnect the different metal traces in different RDL layers. Dielectric layers 70 may also be formed of a polymer such as PBO, BCB, polyimide, or an inorganic material such as silicon oxide, silicon nitride, silicon oxynitride, or the like. Electrical connectors 74 may also be solder regions, metal pillars with solder caps, or the like.

In subsequent steps, package 62 is sawed apart into a plurality of packages, each including one of device dies 48 and the corresponding through-vias 46. The packages may then be bonded to other package component to form PoP packages.

FIGS. 13 through 23 illustrate cross-sectional views of intermediate stages in the formation of a fan-out package in accordance with alternative embodiments. Unless specified otherwise, the materials and the formation methods of the components in these embodiments are essentially the same as the like components, which are denoted by like reference numerals in the embodiments shown in FIGS. 1 through 12. The details regarding the formation process and the materials of the components shown in FIGS. 13 through 23 may thus be found in the discussion of the embodiment shown in FIGS. 1 through 12.

Figure 13:
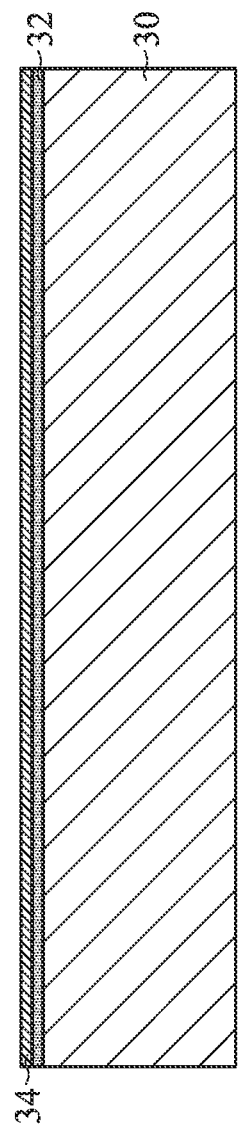
FIGS. 13 through 23 illustrate the cross-sectional views of intermediate stages in the formation of a package in accordance with alternative embodiments.

Referring to FIG. 13, adhesive layer 32 is formed on carrier 30, followed by the formation of sacrificial layer 34 over adhesive layer 32. Sacrificial layer 34 may be formed of HMDS in accordance with some embodiments. The formation of the HMDS may be essentially the same as in the embodiments shown in FIG. 1, and hence is not repeated herein. Accordingly, sacrificial layer 34 may be a couple of mono layers thick in accordance with some exemplary embodiments.

Figure 14:
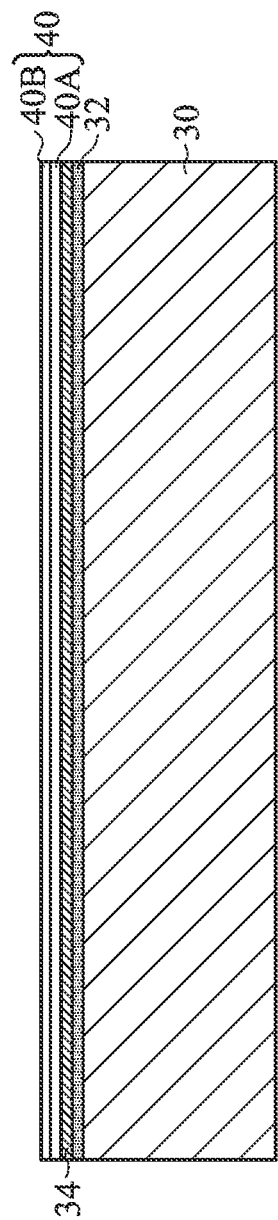

Next, referring to FIG. 14, metal seed layer 40 is formed over sacrificial layer 34, with an entirety the bottom surface of metal seed layer 40 in contact with the top surface of sacrificial layer 34. In accordance with some embodiments, seed layer 40 includes metal layer 40A and copper layer 40B over the metal layer 40A. Metal layer 40A and copper layer 40B include different metals and/or have different compositions, wherein metal layer 40A may or may not include copper therein. In some exemplary embodiments, metal layer 40A is formed of a non-copper metal such as titanium. Accordingly, metal layer 40A is referred to as titanium layer 40A, while it can also be formed of other non-copper metals. The titanium layer is in contact with sacrificial layer 34. Seed layer 40 is planar, with both the top surface and the bottom surface being planar in these embodiments.

Figure 15:
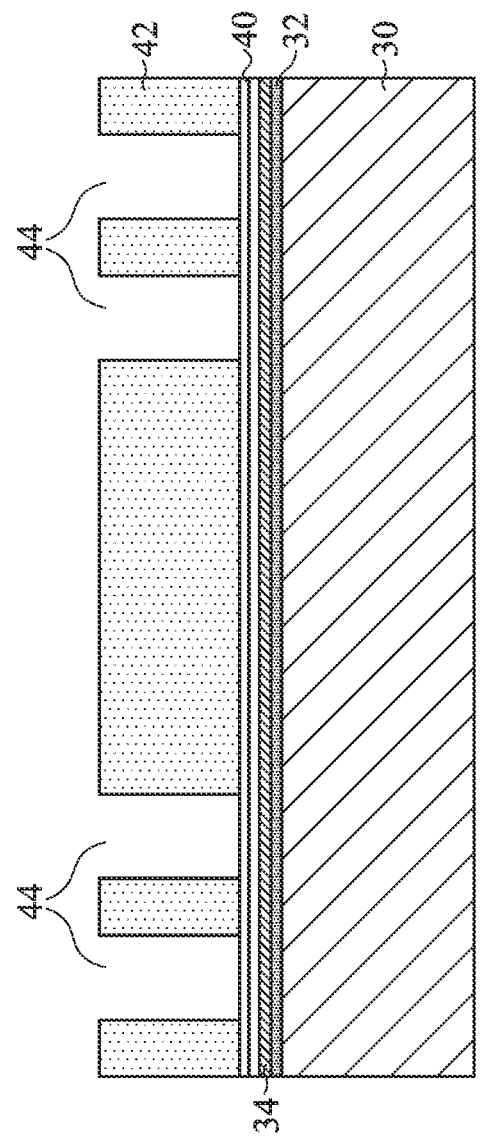
Figure 16:
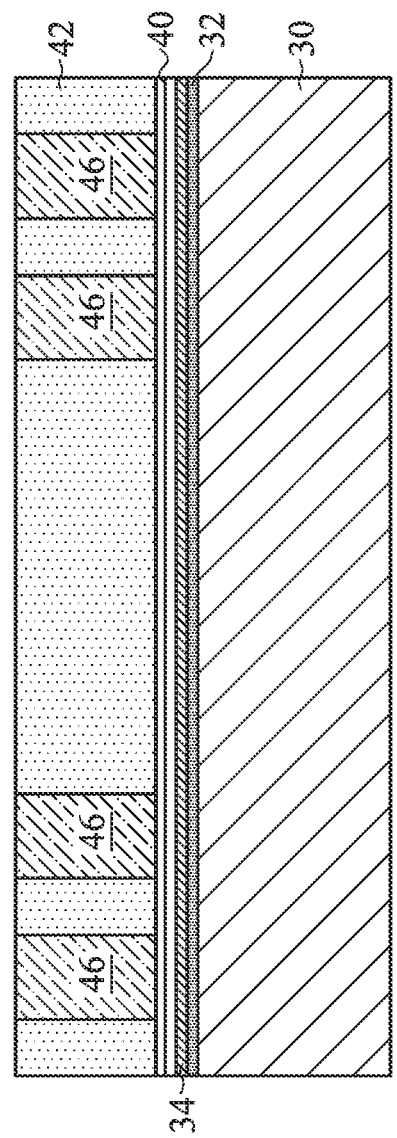

Next, referring to FIG. 15, photo resist 42 is formed over seed layer 40, and is then patterned, so that some portions of seed layer 40 are exposed through openings 44 in photo resist 42. FIG. 16 illustrates the formation of through-vias 46, for example, through plating. Next, photo resist 42 is removed, and the portions of metal seed layer 40 underlying the removed photo resist 42 are exposed. The resulting structure is shown in FIG. 17.

Figure 17:
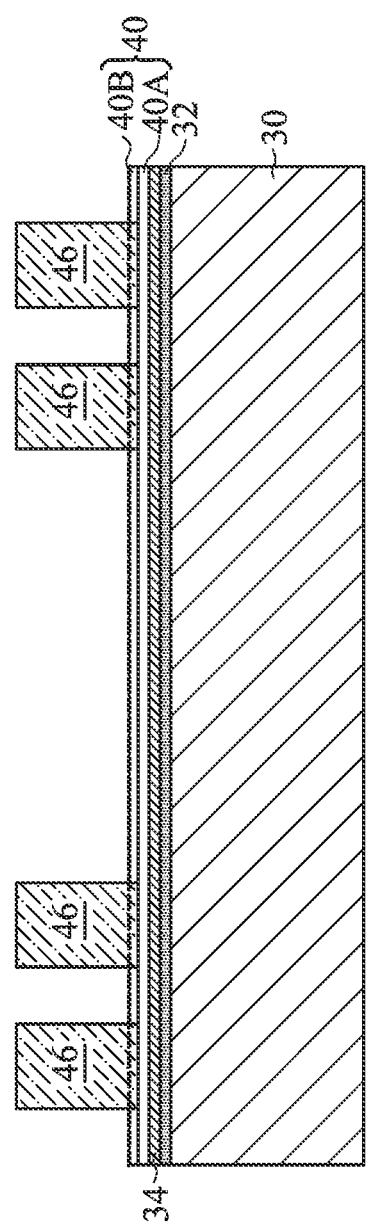
Figure 18:
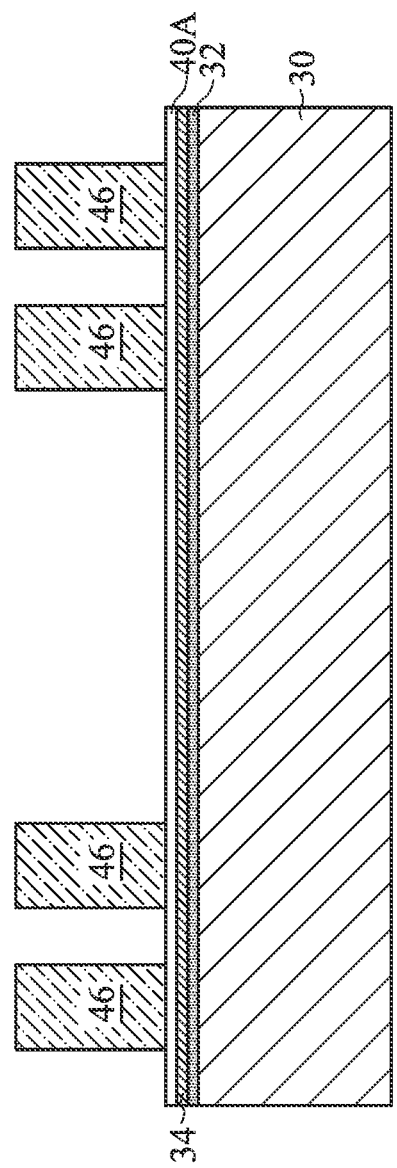

FIG. 17 illustrates the removal of the copper layer 40B in seed layer 40, wherein the removed copper portions 40B are illustrated using dashed lines. The portions of the copper layer 40B overlapped by through-vias 46 are merged with the overlying through-vias 46, and hence are not illustrated separately. After the removal of copper portions 40B, titanium layer 40A in seed layer 40 is exposed, and may be left un-etched until later steps, as shown in FIG. 18.

In the steps shown in FIGS. 15 through 18, sacrificial layer 34 prevents the chemicals used in these process steps from reaching adhesive layer 32. Although sacrificial layer 34 may be thin, it is resistant to the chemicals. Furthermore, sacrificial layer 34 is a dense layer, and hence the chemicals are not able to penetrate through sacrificial layer 34 to reach adhesive layer 32.

Figure 19:
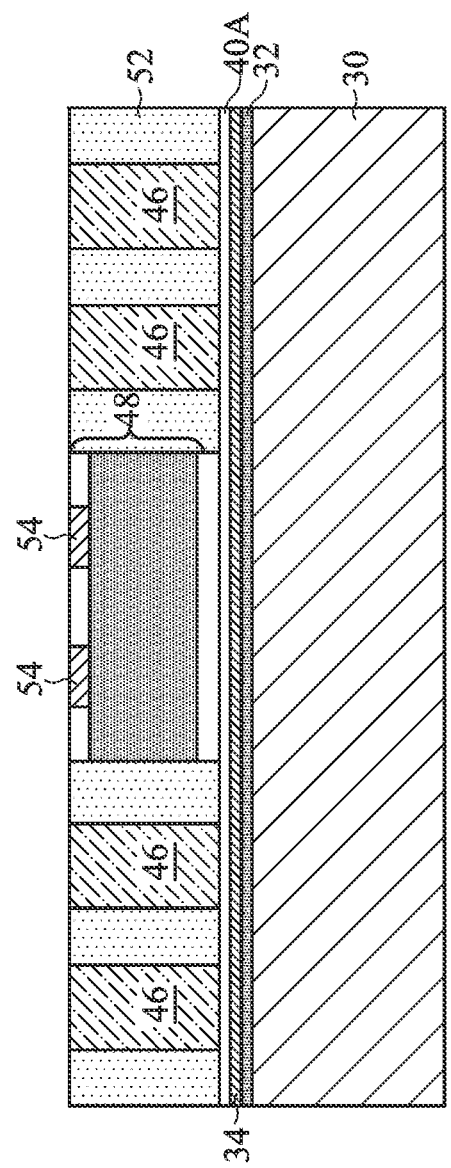
Figure 20:
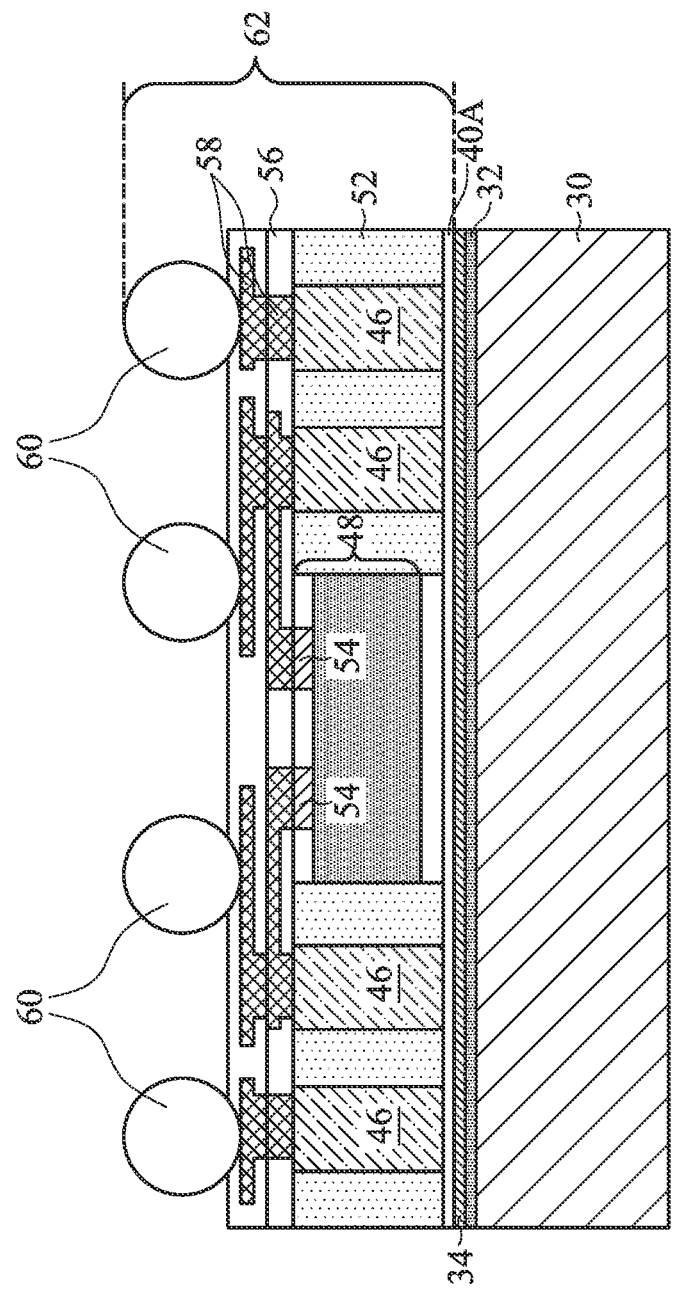

FIG. 19 illustrates the placement of device die 48, and the molding of through-vias 46 and device die 48 in molding material 52. A planarization is then performed to expose metal pillars 54 and through-vias 46, wherein the top surfaces of metal pillars 54, through-vias 46, and molding material 52 are level with each other. In subsequent steps, as shown in FIG. 20, portions of package 62 including dielectric layers 56, RDLs 58, and electrical connectors 60 are formed.

Package 62 is then de-bonded from carrier 30. In some exemplary de-boding process, dicing tape 64 (FIG. 21) is attached to package 62 to protect electrical connectors 60, wherein dicing tape 64 is fixed by dicing frame 66. The de-bonding is performed, for example, by projecting a UV light or a laser on adhesive layer 32 (FIG. 20). For example, when adhesive layer 32 is formed of LTHC, the heat generated from the light or laser causes the LTHC to decompose, and hence carrier 30 is detached from package 62. Since sacrificial layer 34 is very thin, sacrificial layer 34 is also removed from package 62 as a result of the de-bonding. The resulting structure is shown in FIG. 10, wherein sacrificial layer 34 as shown in FIG. 20 is no longer illustrated.

Figure 21:
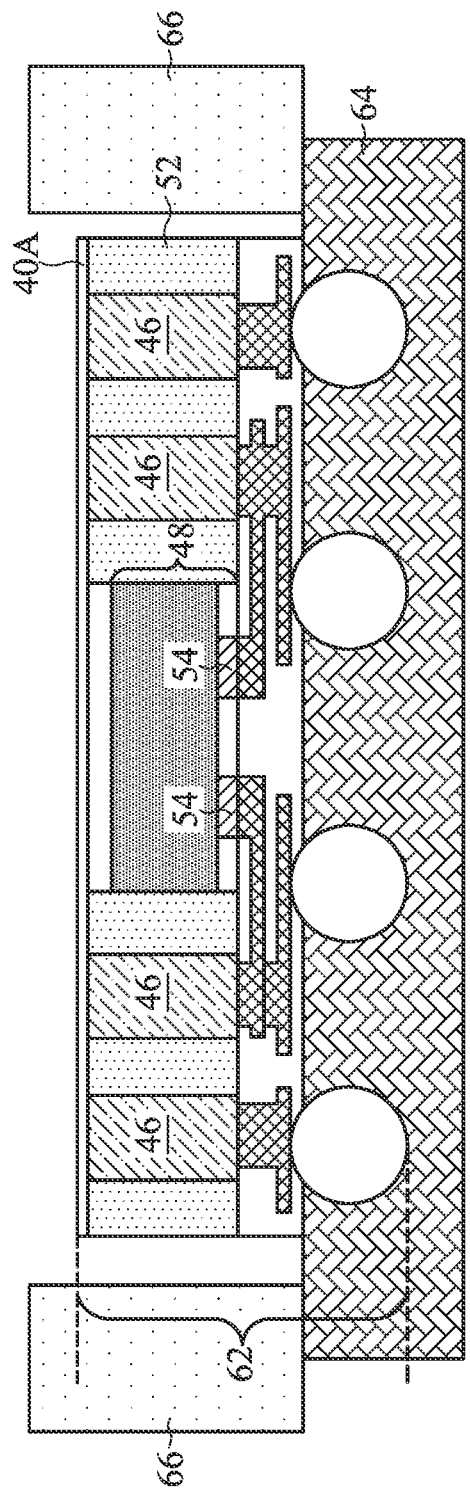
Figure 22:
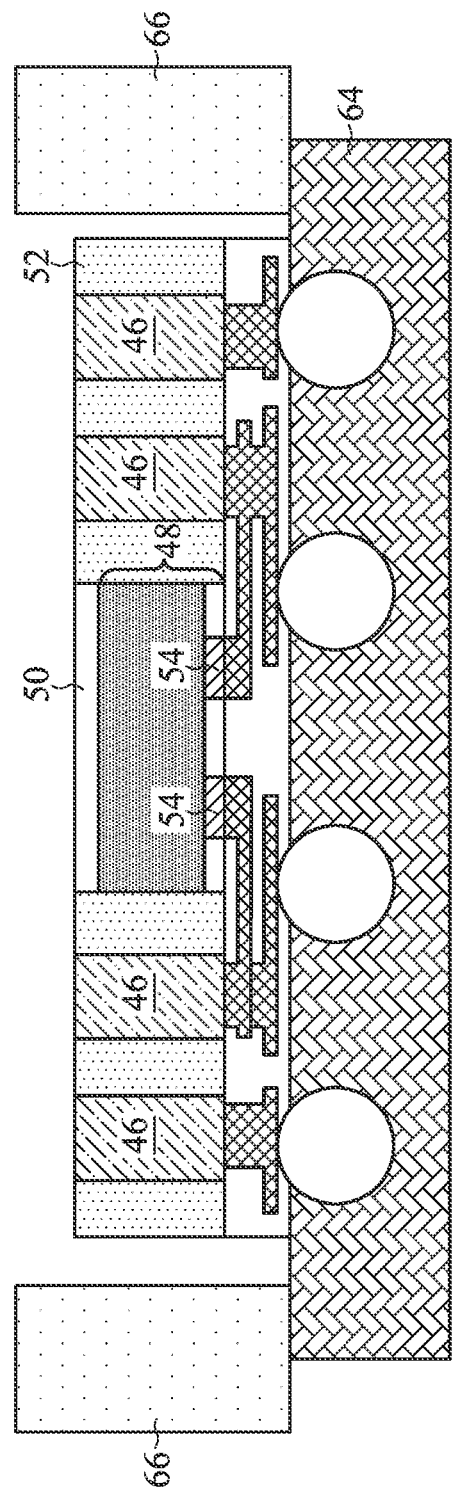

As shown in FIG. 21, layer 40A in metal seed layer is left over device die 48, through-vias 46, and molding material 52. Furthermore, the top surface and the bottom surface of seed layer 40A may be planar. Next, an etching step is performed, so that layer 40A is removed, and the resulting structure is shown in FIG. 22. In some exemplary embodiments, layer 40A is etched in a dry etching step, wherein HF gas may be used. As a result, through-vias 46, die attach film 50, and molding material 52 are exposed.

Figure 23:
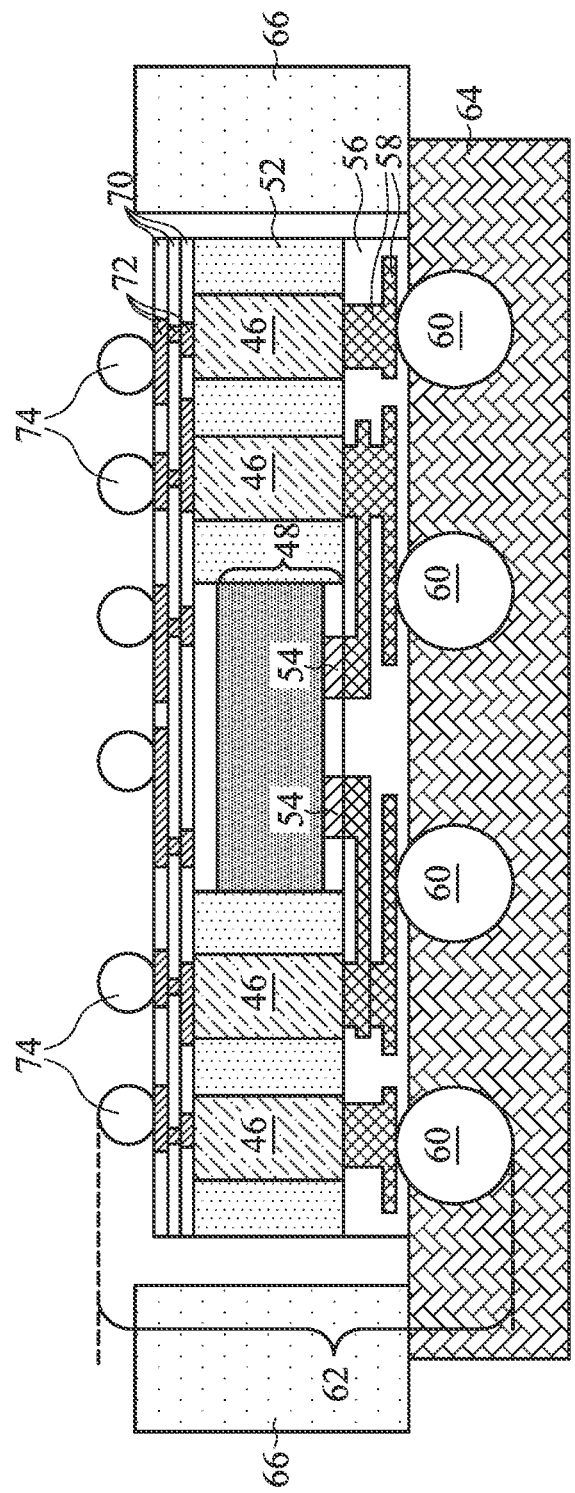
Figure 24:
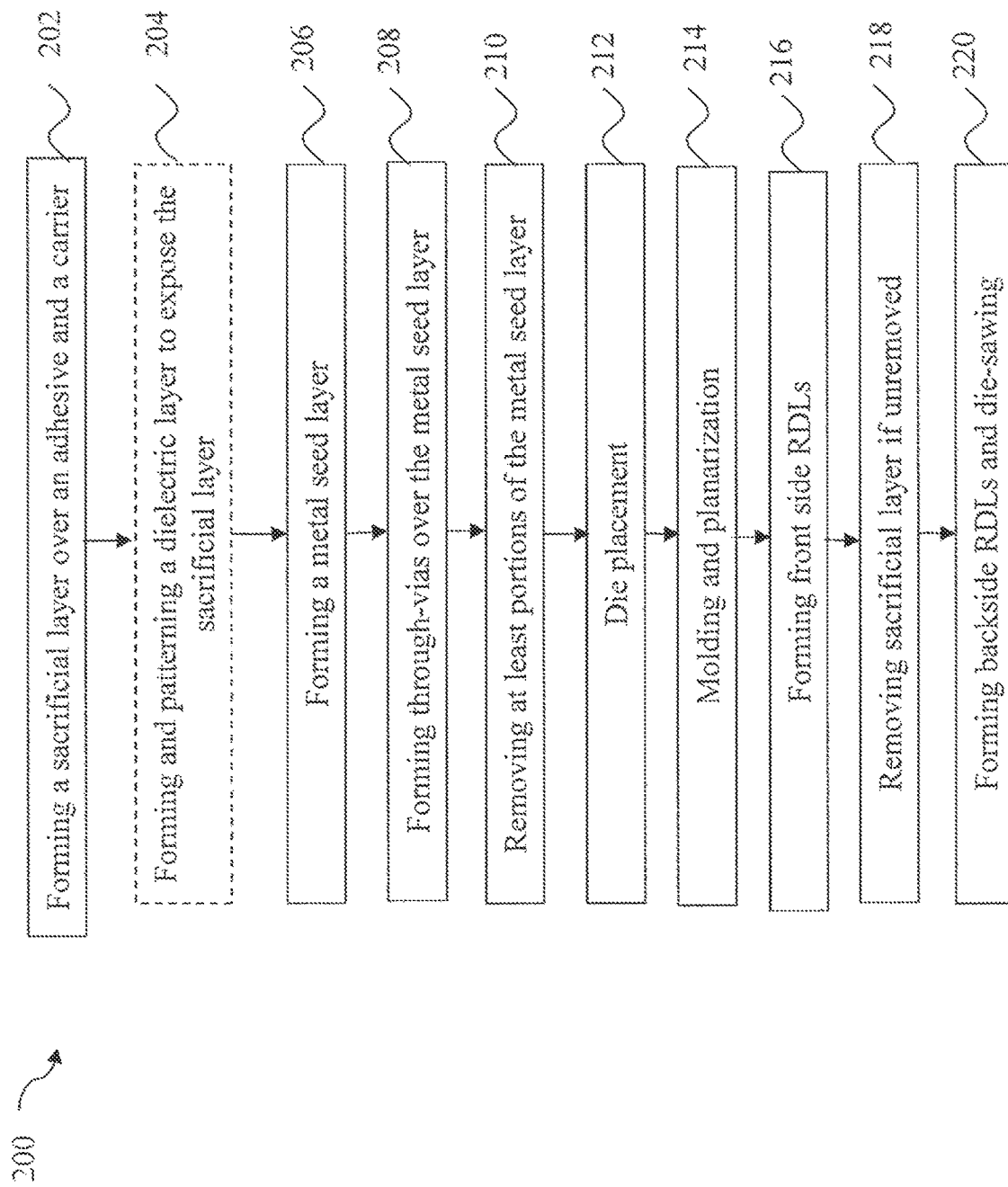
FIG. 24 illustrates a process flow for forming a package in accordance with some embodiments.

In subsequent process steps, as shown in FIG. 23, dielectric layers 70, RDLs 72, and electrical connectors 74 are formed. Package 62 may be sawed part into a plurality of packages, which may be bonded to other package components to form PoP packages.

The embodiments of the present disclosure have some advantageous features. By using the sacrificial layer to protect the adhesive layer such as the LTHC, the adhesive layer is not damaged in the packaging process, and hence it can function properly during the de-bonding of carrier. Accordingly, in the de-bonding process, the package formed on the sacrificial layer is not damaged.

In accordance with some embodiments of the present disclosure, a method includes forming an adhesive layer over a carrier, forming a sacrificial layer over the adhesive layer, forming through-vias over the sacrificial layer, and placing a device die over the sacrificial layer. The Method further includes molding and planarizing the device die and the through-vias, de-bonding the carrier by removing the adhesive layer, and removing the sacrificial layer.

In accordance with alternative embodiments of the present disclosure, a method includes forming an LTHC layer over a carrier, forming a sacrificial layer over the LTHC layer, forming a metal seed layer over the sacrificial layer, plating through-vias over the metal seed layer, and etching portions of the metal seed layer un-covered by the through-vias. A device die is placed over the sacrificial layer. The device die and the through-vias are then molded in a molding material and planarized, wherein conductive features at a surface of the device die and the through-vias are exposed through the molding material. The carrier is then de-bonded by projecting a light to the LTHC layer to decompose the LTHC layer. The sacrificial layer is then removed.

In accordance with yet alternative embodiments of the present disclosure, a method includes forming an adhesive layer over a carrier, sputtering a first titanium layer over the adhesive layer, and forming and patterning a polymer layer over the first titanium layer, with portions of the first titanium layer exposed through the polymer layer. The method further includes forming a metal seed layer, which includes first portions over the polymer layer, and second portions extending into openings in the polymer layer to contact the first titanium layer. The metal seed layer includes a second titanium layer contacting the first titanium layer, and a copper layer over the second titanium layer. Through-vias are plated over the metal seed layer. Some portions of the copper layer and the second titanium layer un-covered by the through-vias are then etched. A device die is placed over the polymer layer. The method further includes molding the device die and the through-vias in a molding material and planarizing the device die and the through-vias, de-bonding the carrier to remove the adhesive layer and the carrier from the first titanium layer, and etching to remove an entirety of the first titanium layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a Light-To-Heat-Conversion (LTHC) layer over a carrier;
    forming a metal seed layer over the LTHC layer, wherein the metal seed layer comprises a first metal layer comprising a first metal, and a second metal layer over the first metal layer, wherein the second metal layer comprises a second metal;
    forming a metallic region on the metal seed layer;
    etching the second metal layer, wherein a first portion of the metallic region and a second portion of the second metal layer directly under the first portion collectively form a metal post;
    attaching a device die to the first metal layer through a die-attach film;
    encapsulating the device die and the metal post in a molding compound to form a package;
    de-bonding the package from the carrier; and
    removing the first metal layer, wherein after the first metal layer is removed, the die-attach film is revealed.

2. The method of claim 1, wherein the removing the first metal layer is performed after the device die is encapsulated.

3. The method of claim 1 further comprising attaching the package to a dicing tape, wherein the first metal layer is removed at a time when the package is attached to the dicing tape.

4. The method of claim 1 further comprising forming a sacrificial layer over the LTHC layer, wherein the first metal layer is further deposited on the sacrificial layer.

5. The method of claim 4, wherein the forming the sacrificial layer comprises conducting a hexamethyldisilane (HMDS) gas to form a HMDS layer on the LTHC layer.

6. The method of claim 1, wherein the first metal layer comprises titanium, and the second metal layer comprises copper.

7. The method of claim 1, wherein an entirety of the first metal layer is removed.

8. The method of claim 1, wherein at a time the package is de-bonded from the carrier, the first metal layer is a blanket layer.

9. A method comprising:
    depositing a metal layer over a carrier, wherein the metal layer comprises a first metal layer and a second metal layer over the first metal layer;
    forming a package over and contacting the metal layer, wherein the forming the package comprises:
        forming metal posts over and in physical contact with the first metal layer, wherein the metal posts comprise portions of the second metal layer; and
        encapsulating the metal posts in an encapsulant;
    de-bonding the metal posts and the package from the carrier; and
    after the de-bonding, removing the first metal layer.

10. The method of claim 9, wherein the depositing the metal layer comprises depositing a titanium layer as the first metal layer, and depositing a copper layer as the second metal layer.

11. The method of claim 9, wherein the removing the first metal layer comprises a dry etching process.

12. The method of claim 9 further comprising forming redistribution lines electrically connected to the metal posts, wherein before the redistribution lines are formed, an entirety of the first metal layer is removed.

13. The method of claim 9, wherein at a time the metal posts and the package are de-bonded from the carrier, the first metal layer is a blanket layer.

14. The method of claim 13 further comprising forming a sacrificial layer over the carrier, with the metal layer being formed over the sacrificial layer, wherein at the time the metal posts and the package are de-bonded from the carrier, the first metal layer fully covers the sacrificial layer.

15. The method of claim 14, wherein the sacrificial layer comprises hexamethyldisilane (HMDS).

16. The method of claim 9, wherein the metal posts are formed through a plating process, and the metal layer is used as a metal seed layer for the plating process.

17. The method of claim 9, wherein the first metal layer comprises titanium.

18. A method comprising:
    forming a sacrificial layer over a carrier;
    depositing a metal layer on the sacrificial layer, wherein the metal layer comprises a first metal layer and a second metal layer over the first metal layer;
    patterning at least a portion of the metal layer;
    placing a device die over the metal layer;
    encapsulating the device die in a molding compound;
    planarizing the molding compound and the device die; and
    after the planarizing, removing the sacrificial layer and the carrier.

19. The method of claim 18 further comprising, before the device die is placed, patterning the second metal layer to reveal the first metal layer.

20. The method of claim 18, wherein at a time the removing the sacrificial layer is started, the first metal layer is a blanket layer covering the molding compound.

* * * * *